US010424521B2

(12) United States Patent
Leal

(10) Patent No.: US 10,424,521 B2
(45) Date of Patent: Sep. 24, 2019

(54) PROGRAMMABLE STITCH CHAINING OF DIE-LEVEL INTERCONNECTS FOR RELIABILITY TESTING

(71) Applicant: FREESCALE SEMICONDUCTOR, INC., Austin, TX (US)

(72) Inventor: George R. Leal, Cedar Park, TX (US)

(73) Assignee: NXP USA, INC., Austin, TX (US)

(*) Notice: Subject to any disclaimer, the term of this patent is extended or adjusted under 35 U.S.C. 154(b) by 716 days.

(21) Appl. No.: 14/276,262

(22) Filed: May 13, 2014

(65) Prior Publication Data

US 2015/0332980 A1 Nov. 19, 2015

(51) Int. Cl.
H01L 21/66 (2006.01)
G01R 31/26 (2014.01)
G01R 31/28 (2006.01)
H01L 23/525 (2006.01)

(52) U.S. Cl.
CPC .......... H01L 22/34 (2013.01); G01R 31/2607 (2013.01); G01R 31/2856 (2013.01); H01L 22/14 (2013.01); H01L 23/5256 (2013.01); H01L 23/5252 (2013.01); H01L 2224/16225 (2013.01); H01L 2924/15311 (2013.01)

(58) Field of Classification Search
CPC ........ G01R 31/26; G01R 31/28; H01L 23/525
USPC .............................. 324/750; 257/530; 438/15
See application file for complete search history.

(56) References Cited

U.S. PATENT DOCUMENTS

| 5,813,881 | A | * | 9/1998 | Nathan | G01R 1/04 |
|---|---|---|---|---|---|
| | | | | | 257/529 |
| 6,605,956 | B2 | * | 8/2003 | Farnworth | G01R 31/31701 |
| | | | | | 257/E21.526 |
| 6,804,156 | B2 | | 10/2004 | Ito | |
| 6,911,360 | B2 | | 6/2005 | Li et al. | |
| 7,340,644 | B2 | | 3/2008 | Sutardja et al. | |
| 8,349,666 | B1 | | 1/2013 | Leal et al. | |
| 8,368,172 | B1 | | 2/2013 | Leal et al. | |
| 2005/0181546 | A1 | * | 8/2005 | Madurawe | H01L 21/8221 |
| | | | | | 438/132 |
| 2005/0263850 | A1 | * | 12/2005 | Aitken | H01L 28/20 |
| | | | | | 257/536 |
| 2009/0224242 | A1 | * | 9/2009 | Cowles | G01R 31/2884 |
| | | | | | 257/48 |
| 2010/0283085 | A1 | * | 11/2010 | Bemanian | H01L 24/14 |
| | | | | | 257/209 |
| 2011/0002188 | A1 | * | 1/2011 | Chen | G11C 17/16 |
| | | | | | 365/225.7 |
| 2013/0020674 | A1 | * | 1/2013 | Leal | H01L 23/5256 |
| | | | | | 257/530 |

* cited by examiner

Primary Examiner — Akm Zakaria

(57) ABSTRACT

A method includes fabricating a set of die in a production run, each die comprising a set of pads at a periphery of a top metal layer, a first set of fuse elements, and a second set of fuse elements. Each fuse element of the first set of fuse elements couples a corresponding pad of the set to a corresponding bus when in a conductive state, and each fuse element of the second set couples a corresponding subset of pads of the set together when in a conductive state. The method further includes selecting a subset of the die of the production run for testing, and configuring each die of the subset for testing by placing each fuse element of the first set in a non-conductive state and placing each fuse element of the second set in a conductive state.

14 Claims, 6 Drawing Sheets

PROGRAMMABLE STITCH CHAINING OF DIE-LEVEL INTERCONNECTS FOR RELIABILITY TESTING

BACKGROUND

Field of the Disclosure

The present disclosure relates generally to integrated circuit (IC) packaging and, more particularly, to IC package testing.

Description of the Related Art

Integrated circuit (IC) devices are modeled and tested throughout the fabrication process in order to assure that the components of the IC device are meeting both industry standards and customer requirements. While it is common in the industry to test and gather board level reliability (BLR) test net data for ball grid array (BGA) interconnects and other board-level interconnects using production parts, BLR data for die-level interconnect test nets conventionally has been difficult to obtain on production parts, and thus manufacturers typically have to resort to the design and fabrication of a function specific IC test vehicle and component package to enable daisy chain testing of the die-level interconnects of the IC package design. Designing a special test vehicle chip solely for die-level daisy chain testing can be impractical in view of the expense and resources involved, but the lack of this test data can place the manufacturer at a disadvantage relative to its competitors.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
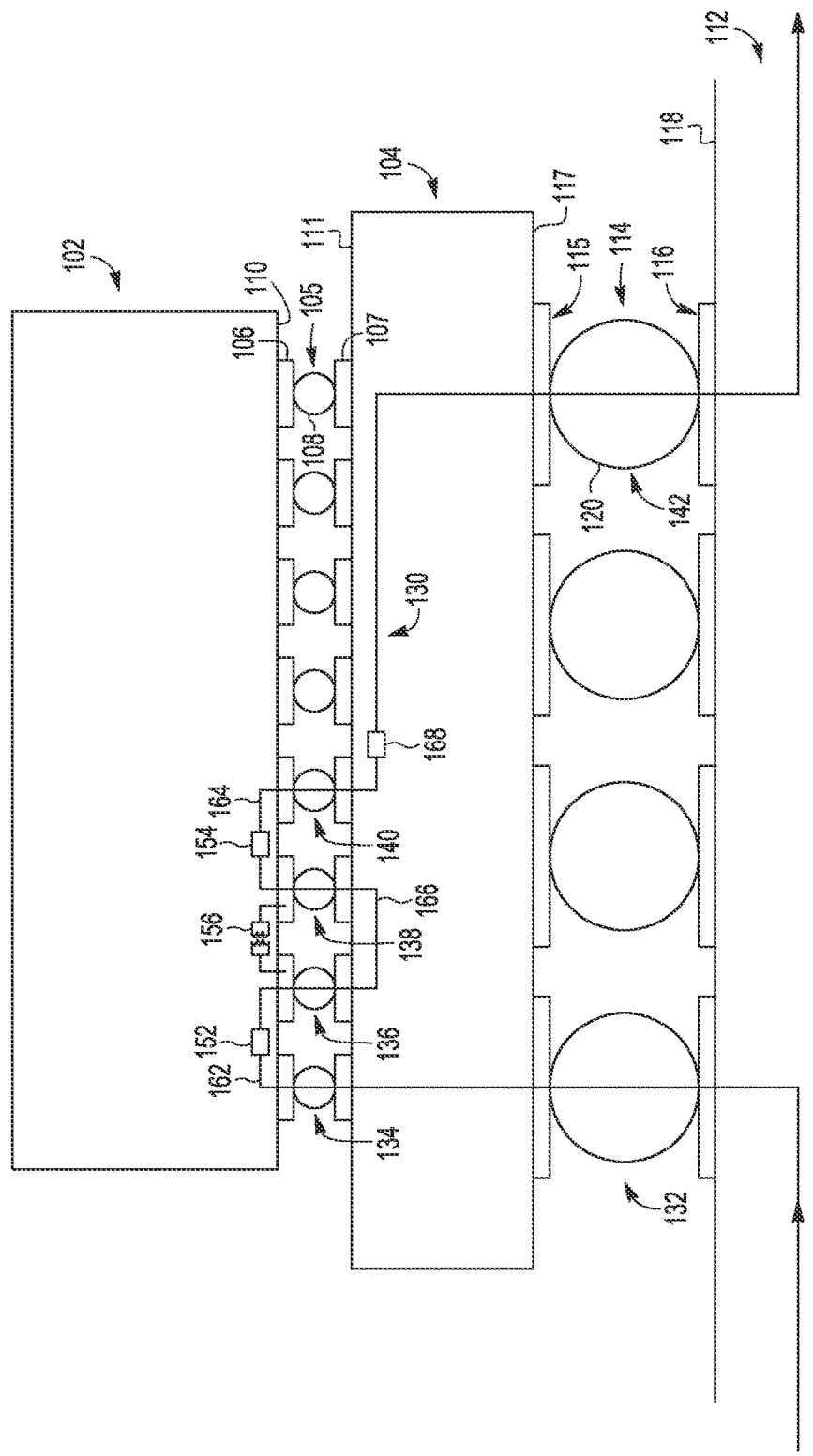
FIG. 1 illustrates a cross-sectional view of an integrated circuit (IC) device implementing a programmable stitch chain formed between a die and a substrate in accordance with some embodiments.

FIGS. 1-6 illustrate embodiments of an integrated circuit (IC) device implementing a die that is designed and fabricated to operate in either a production mode or a test mode. When in production mode, the IC device operates according to its production design and function (that is, for use in a non-test environment). When in test mode, the die reconfigures the connections between certain die pads so as to form pad-to-pad links that, in conjunction with links formed between pads on the substrate on which the die is disposed, form a stitch chain that routes back and forth between the die and substrate through the die-substrate interconnects, and thus facilitates board level reliability (BLR) testing of the die-level interconnects of the IC device.

Accordingly, rather than requiring the design and fabrication of a separate test vehicle die, the techniques described herein provide an ability to convert a distributable, or saleable, production die to a test die. This feature can be designed into each production die design, and one or more of the production-run die therefore may be selected and repurposed as test dies for use in test IC devices by reprogramming the production-run die from the production mode to the test mode.

In at least one embodiment, the programmability of the die for the default production and optional test modes is achieved through the use of fuse elements that, when in the production mode, selectively couple certain die pads to their respective power or signal busses and decouple certain die pads from each other, and when in the test mode, decouple certain die pads from their respective power or signal busses and couple certain die pads together to form links in a corresponding stitch chain that is then formed between the die and the substrate through the corresponding die-substrate interconnects. Depending on the state of the connection between pads or between pad and power bus in the corresponding mode formed by each fuse element, the fuse element may be operate as a fuse (fabricated as conductive but can be programmed to be non-conductive) or as an anti-fuse (fabricated as non-conductive but can be programmed to be conductive). The fuse elements can be implemented as sacrificial fuses and anti-fuses (e.g., metal or polysilicon strips), as electronic fuses (e-fuses) and anti-electronic fuses (anti-e-fuses), or combinations thereof. The programming of the fuse elements can be performed by a variety of techniques. For example, sacrificial fuses are programmed to be non-conductive by "blowing" the sacrificial fuse element by the use of over-current or the use of laser trimming while electronic fuses are programmed to be conductive or non-conductive by the use of a programming signal. For ease of reference, the term "anti-fuse" refers to either a sacrificial anti-fuse or an anti-e-fuse unless otherwise noted, and the term "fuse" refers to either a sacrificial fuse or an e-fuse, unless otherwise noted.

To reduce the complexity of forming the stitch chain, in at least one embodiment the test mode feature involves only the use of pads connected to power busses or are otherwise used for conducting power rather than signaling. For ease of illustration, various example implementations are described below in the context of pads connected to power busses. However, these techniques are not limited to this context, and in some embodiments the techniques described herein may be used for pads connected to signal busses or otherwise connected signal I/O, or for a combination of signal bus pads and power bus pads.

Circumstances of the IC to package assembly process often render the die-level interconnects at the periphery of a die the least reliable die-level interconnects in an IC device or package. In at least some embodiments, the implementation of the stitch chain for testing purposes is focused on the power pads at the periphery of the die, specifically at the corners of the die. To illustrate, one stitch chain may be designed to incorporate the power pads formed at one corner of the die, while another stitch chain may be designed to incorporate the power pads formed at the opposite corner of the die. Alternatively, a stitch chain may involve power pads disposed along one or more edges of the die. Further, as the involved die pads are at the periphery of the die, in some embodiments, some or all of the fuse elements used to enable the test mode programmability may be disposed in corner regions or other keep-out zones (i.e., those areas of the die in which the circuit layout design otherwise is prevented from using due to constraints related to singulation, thermal management, mounting, etc.) at the periphery of the die and in which circuitry typically is not formed due to reliability concerns on the part of the fabrication plant. By using a keep-out zone of the die for fabricating the fuse elements used to implement this programmability, the programmability circuitry can use floorplan space on the die that otherwise would go unused. The programmability circuitry therefore can be implemented in a manner that does not substantially displace other circuitry in the floorplan of the die, and thus does not impact the die size appreciably.

FIG. 1 illustrates a cross-sectional view of an integrated circuit (IC) device 100 configurable into either a production mode for distribution purposes, such as sale, or other use for its designed purposes, or a test mode for use in die-level interconnect and other BLR testing in accordance with some embodiments. The IC device 100 comprises a die 102 disposed on a substrate 104 in a flip-chip, or controlled collapse chip connection (C4), configuration, whereby die-level interconnects 105 are formed between the die 102 and the substrate 104. Each die-level interconnect 105 comprises a die pad 106 disposed at a top metal layer 110 of the die 102, a substrate pad 107 disposed at a top metal layer 111 of the substrate 104, and a solder bump 108 (also commonly referred to as a C4 bump) electrically and mechanically coupling the pads 106 and 107 together. The substrate 104, in turn, is connected to a printed circuit board (PCB) 112 via board-level interconnects 114. Each board-level interconnect 114 comprises a substrate pad 115 disposed at a surface 117 of the substrate 104 opposite the top metal layer 111, a PCB pad 116 disposed at a surface 118 of the PCB 112, and a solder ball 120 or other package-level pin electrically and mechanically coupling the pads 115 and 116 together. Note that while the embodiments detailed herein are described with respect to a flip-chip configuration, the following techniques can be implemented utilizing wirebond technology or other interconnect methods.

The die 102 implements fuse elements that permit the die 102 to be configured according to a production mode or a test mode. In the production mode, the fuse elements are configured such that the die pads 106 are connected to respective power busses or signaling busses/interconnects per the intended saleable production design of the die 102. In the test mode, the fuse elements are reconfigured such that certain die pads 106 are reconnected in pairs so as to form corresponding links in a daisy chain, and a test version of the substrate 104 is implemented such that certain substrate pads 107 are connected in pairs so as to form corresponding intervening links in the daisy chain, such that when the die 102 (programmed for the test mode) and the test version of the substrate 104 are connected, an electrically-continuous daisy chain is formed in the IC device 100 such that the daisy chain stitches between the links in die pads 106 and links in substrate pads 107 via the die-level interconnects 105.

To illustrate, the cross-section view of FIG. 1 depicts an example configuration whereby the die 102 is programmed for this test mode and mounted on a test version of the substrate 104. A stitch chain 130 is formed that may be used during board level testing to test the reliability of the die-level interconnects 105. Reliability testing can include monitoring for changes in resistance across the stitch chain 130 as the test IC device 100 is repeatedly heated and cooled. In the depicted example, the stitch chain 130 routes through metal layers of the PCB 112 into the substrate 104 via a board-level interconnect 132 (an instance of the board-level interconnect 114), and then stitches multiple times between the die 102 and the substrate 104 via die-level interconnects 134, 136, 138, and 140 (instances of the die-level interconnects 105). The stitch chain 130 then routes back to the PCB 112 from the substrate 104 via board-level interconnect 142 (another instance of the board-level interconnect 114). For ease of illustration, the interconnects involved in this stitch chain 130 are in the same plane as that represented by the cross-section view of FIG. 1. However, as described in greater detail below, the interconnects involved in a stitch chain often are clustered in the corners of the die or otherwise clustered along the periphery of the die.

This test configuration of the die 102 for forming part of the stitch chain 130 is achieved through the use of fuse elements formed at one or more layers of the die 102. The fuse elements may be implemented as sacrificial fuses or sacrificial anti-fuses, as e-fuses or anti-e-fuses, or combinations thereof, depending on the connection to be formed by the particular fuse element during test mode and during production mode. To illustrate, programming the die 102 for test mode causes anti-fuses 152 and 154 to be rendered conductive, and fuse 156 to be rendered non-conductive. With anti-fuse 152 rendered conductive, the die pad 106 of the die-level interconnect 134 is electrically connected to the die-pad 106 of the die-level interconnect 136, and thus the illustrated link 162 in the stitch chain 130 is formed. With anti-fuse 154 rendered conductive, the die pad 106 of the die-level interconnect 138 is electrically connected to the die-pad 106 of the die-level interconnect 140, and thus the illustrated link 164 in the stitch chain 130 is formed. With fuse 156 rendered non-conductive, a conductive link is severed between the die pads 106 of the die-level interconnects 136 and 138, thereby permitting the implementation of the illustrated link 166 of the stitch chain 130 between the pads 107 of the die-level interconnects 136 and 138 in the substrate 104. Fuse elements, such as fuse element 168, also may be implemented in the substrate 104 to permit the substrate 104 to be programmed for test mode in the same manner.

Figure 2:
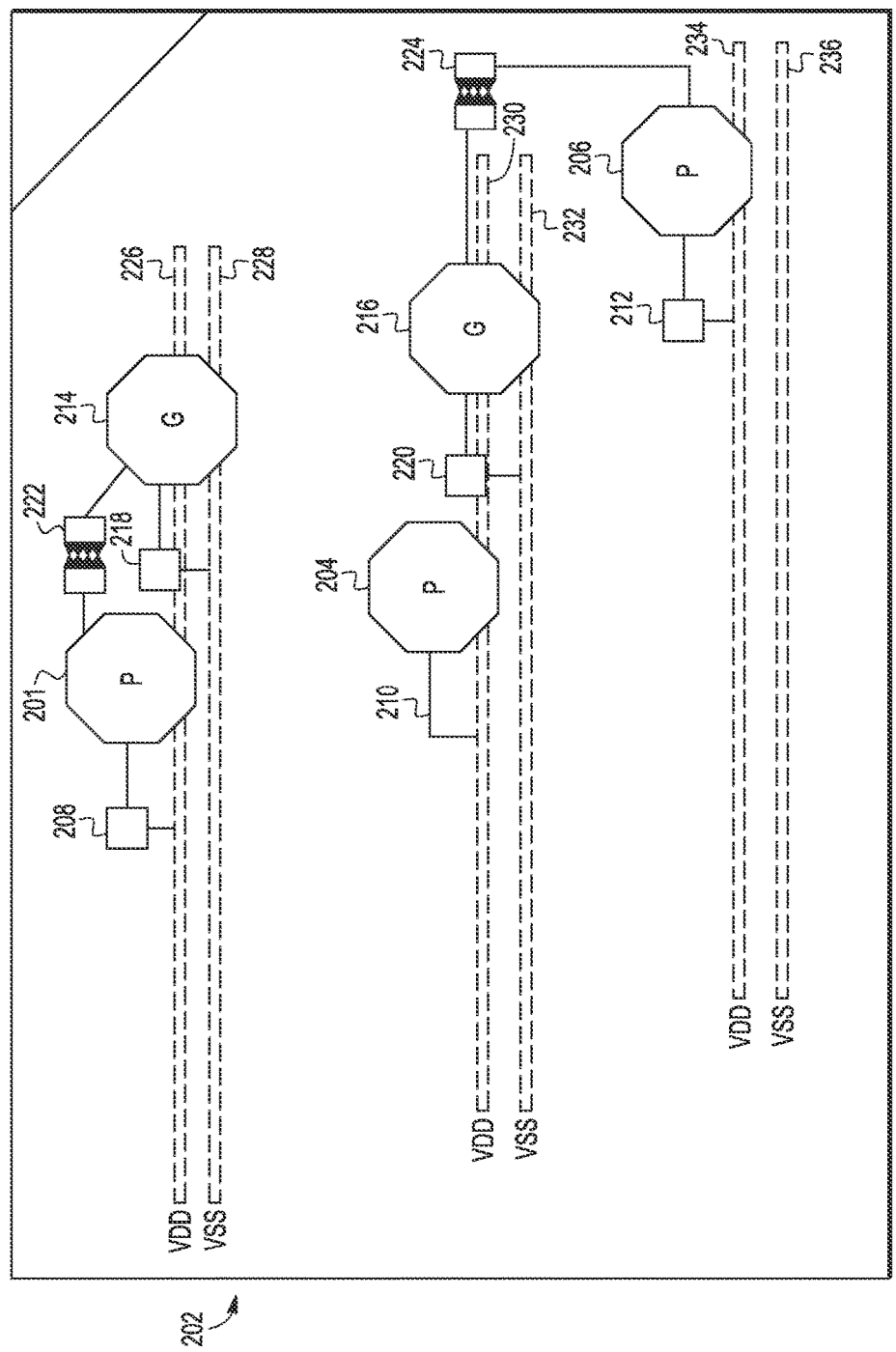
FIG. 2 illustrates a top view of the die of the IC device of FIG. 1 including a plurality of pads configured according to a production mode in accordance with some embodiments.
Figure 3:
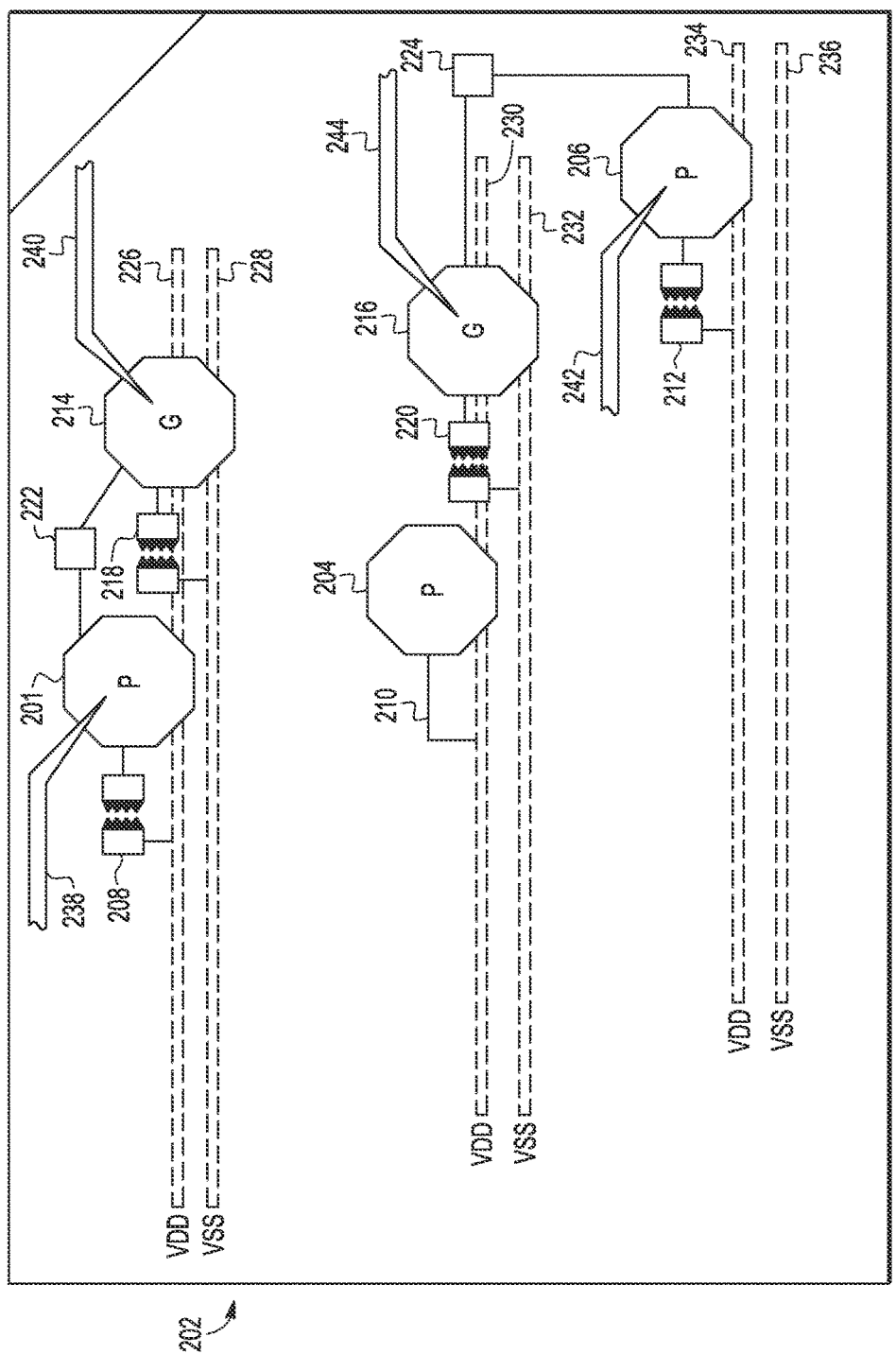
FIG. 3 illustrates a top view of the die of the IC device of FIGS. 1 and 2 during programming of the die for a test mode in accordance with some embodiments.
Figure 4:
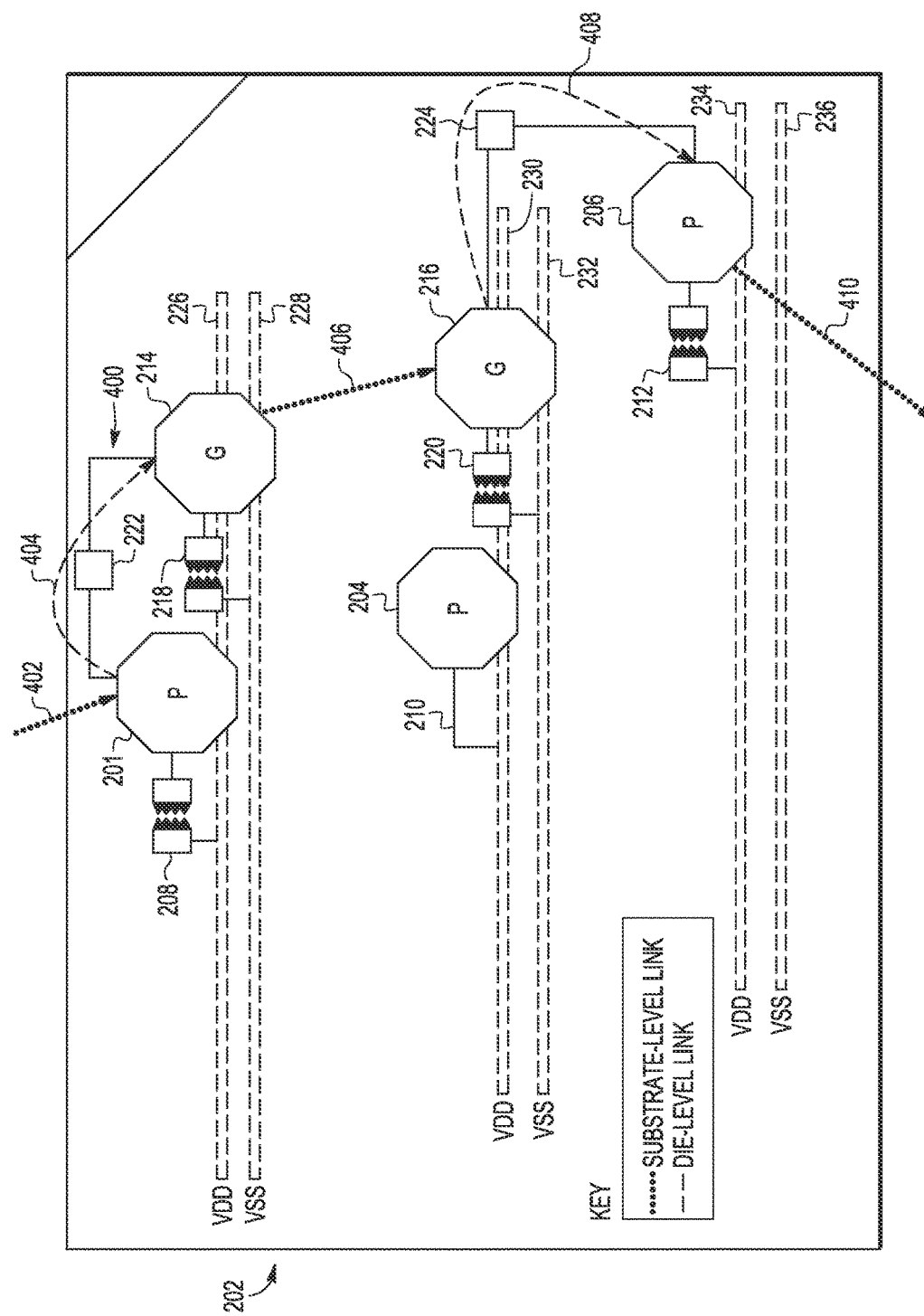
FIG. 4 illustrates a top view of the die of the IC device of FIGS. 1 and 2 including the plurality of pads configured according to the test mode in accordance with some embodiments.

FIGS. 2-4 together illustrate the process of reconfiguring a die from the production mode to the test mode using sacrificial fuse elements in accordance with some embodiments. FIG. 2 depicts a top view of a die 202 (corresponding to the die 102, FIG. 1) programmed for the production mode. The top metal layer of the die 202 implements die pads 201 and 206 that are coupled to respective VDD power buses 226 and 234 via a plurality of fuses 208 and 212, as well as die pad 204 that is coupled to VDD power bus 230 through conventional metal wiring in the die not requiring the use of a fuse element. As die pads 201, 204, and 206 are connected to the VDD power busses 226, 230, and 234 in this mode, the die pads 201, 204, and 206 also are referred to herein as "power pads" 201, 204, and 206. The top metal layer of the die 202 further implements die pads 214 and 216 that are coupled to respective VSS power busses 228 and 232 by a plurality of fuses 218 and 220. As die pads 214 and 216 are connected to the VSS power busses 228 and 232 in this mode, the die pads 214 and 216 also are referred to herein as "ground pads" 214 and 216. The die 202 further implements anti-fuse 222 connected between power pad 201 and ground pad 214 and anti-fuse 224 connected between power pad 206 and ground pad 216. The top metal layer 202 is generally reserved for die pads with the VDD and VSS power busses being implemented in the metal layers of the die.

In the mode illustrated in FIG. 2, the fuses 208, 212, 218, and 220 are "unprogrammed" and thus conductive, and thereby couple the die pads 202, 206, 214, and 216 to their respective power busses. Further, the anti-fuses 222 and 224 are likewise "unprogrammed," and thus non-conductive, thereby preventing connectivity between the power pad 201 and the ground pad 214 and preventing connectivity between the power pad 206 and the ground pad 216.

Turning to FIG. 3, a top-view of the die 202 during the process of programming the die 202 to enter the test mode is illustrated. As the fuse elements of this example are sacrificial fuses and sacrificial anti-fuses, their programming is achieved by applying a current to the fuse element via probe pins applied to the corresponding pads connected to the fuse element. Thus, application of a threshold voltage to the power pad 201 via probe pin 238 "programs" the fuse 208 so as to render the fuse 208 non-conductive, thereby electrically isolating the power pad 201 from the VDD bus 226. Likewise, application of a threshold voltage to the ground pad 214 via probe pin 240 "programs" the fuse 218 so as to render the fuse 218 non-conductive, thereby electrically isolating the ground pad 214 from the VSS bus 228. Further, a voltage differential between the power pad 201 and the ground pad 214 caused by the probe pins 238 and 240 "programs" the anti-fuse 222 so as to render the anti-fuse 222 conductive, thereby electrically connecting the power pad 201 and the ground pad 214. Similarly, applications of voltages to the power pad 206 and the ground pad 216 via probe pins 242 and 244, respectively, "programs" fuses 212 and 220 and anti-fuse 224, which in turn electrically isolates power pad 206 and ground pad 216 from VDD power bus 234 and VSS power bus 232, respectively, while electrically connecting power pad 206 and ground pad 216. Alternatively, laser trimming can be used to ablate the metal or polysilicon material of the fuses so as to create an electrical discontinuity and thus program these fuses. The timing of the "programming" can be either staggered or simultaneous. Power pad 204, not being coupled to a fuse element, remains coupled to VDD power bus 230 after programming of the surrounding die pads. Power pad 204 remains linked to the remainder of pads located on the die that are not electrically isolated for testing purposes.

FIG. 4 illustrates, via a top view of the die 202, a stitch chain, or daisy chain, 400 formed in die 202 after it has been programmed for the test mode (as shown in FIG. 3) and bonded to a test substrate, such as the substrate 104 of FIG. 1. A substrate-level link 402 of the stitch chain 400 is created by a conductive path formed through a PCB and the test substrate, and through a die-level interconnect (for example, a solder bump) incorporating the pad 201 and the corresponding pad in the substrate. The substrate-level link 402 is followed in the stitch chain 400 by a die-level link 404 formed between the power pad 201 and the ground pad 214 via the programmed anti-fuse 222. The die-level link 404 is followed in the stitch chain 400 by a substrate-level link 406 formed as an electrical path from the ground pad 214 to corresponding substrate pad through a solder bump, and from this substrate pad to another substrate pad through one or more metal interconnects in the metal layers in the substrate, and from this other substrate pad up to the ground pad 216 through a corresponding solder bump. The next link, die-level link 408, is formed as a conductive path between the ground pad 216 and the power pad 206 due to the programmed anti-fuse 224. The die-level link 408 is then followed by a substrate-level link 410 formed by the die-level interconnect connecting the power pad 206 to a corresponding pad of the substrate and then on to another stitch in the chain (not shown), or out through the test substrate and to a PCB.

When the stitch chain 400 is completed with the bonding of the die 202 to the corresponding substrate and the resulting IC device package mounted on a PCB, a test apparatus can drive a current through the stitch chain 400 through the PCB while repeatedly heating and cooling the test apparatus in a thermal cycling environment, and observe the stitch chain for changes in resistance or a complete open during the test process. From the information obtained from this test, BLR data can be generated for the die-level interconnects involved in the stitch chain, and thus the die-level interconnects for the IC device can be characterized. Thus, in this manner, BLR data for die-level interconnects can be provided to customers without requiring the design and fabrication of separate test die merely for testing purposes, as opposed to the die described herein that are manufactured as part of a standard production run.

Figure 5:
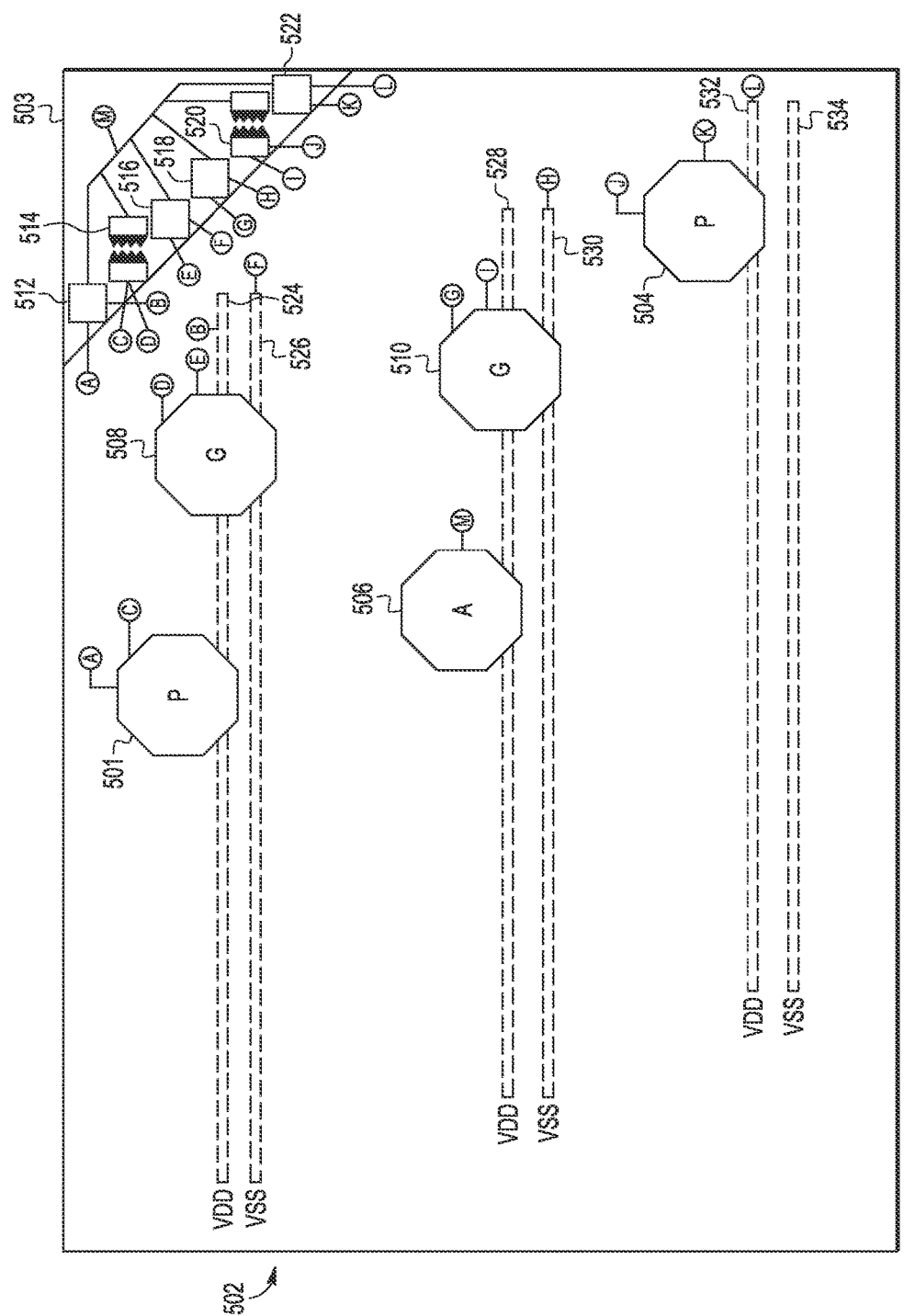
FIG. 5 illustrates a top view of an alternative implementation of the die of the IC device of FIG. 1 in which fuse elements are disposed in a keep-out zone of the die in accordance with some embodiments.
Figure 6:
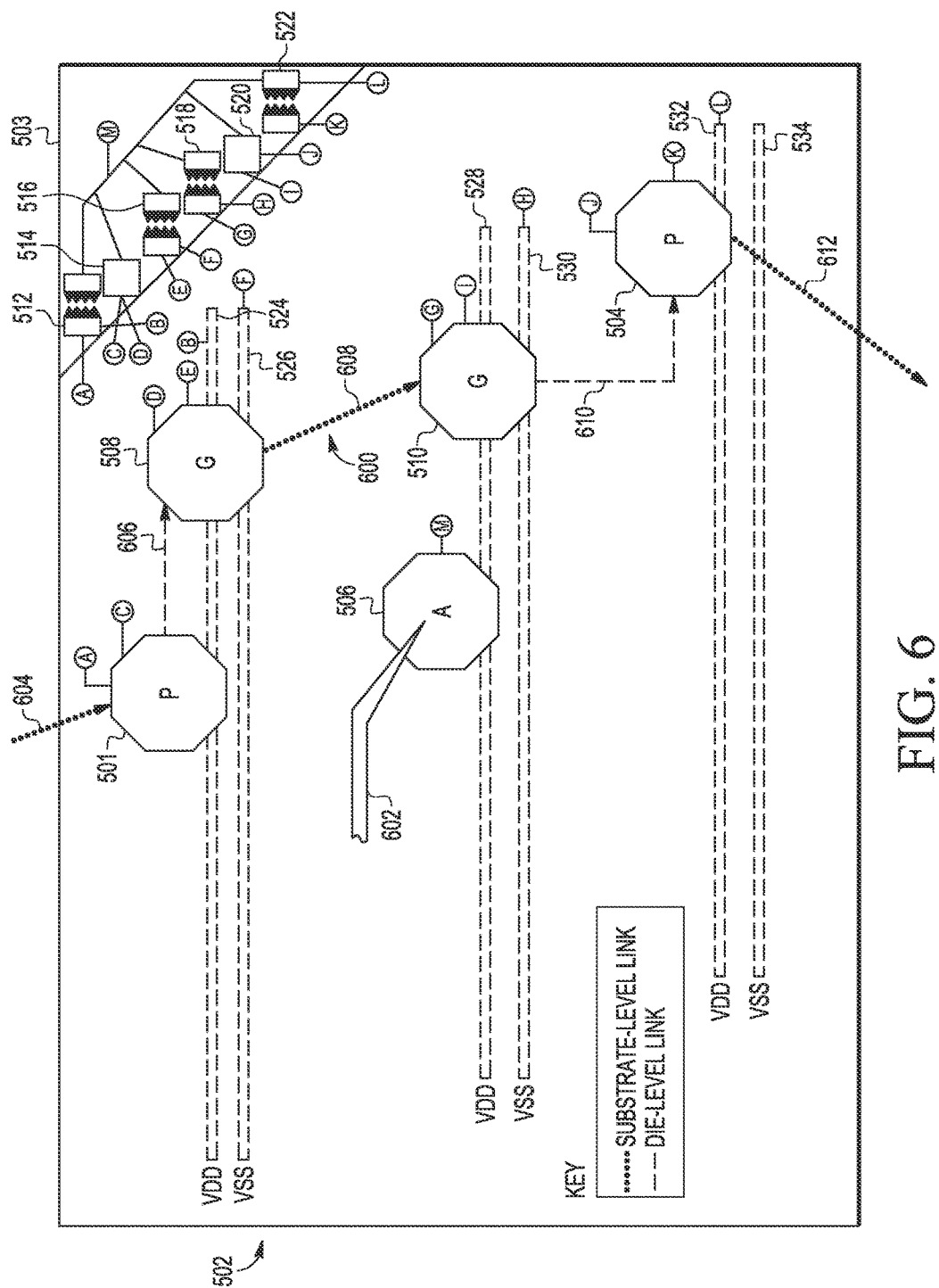
FIG. 6 illustrates a top view of the die of the IC device of FIGS. 1 and 5 during programming of the die for a test mode in accordance with some embodiments.

FIGS. 5 and 6 together illustrate a process to reconfigure the die from the production mode to the test mode using sacrificial fuse elements in accordance with some embodiments. FIG. 5 depicts a top view of a die 502 (corresponding to the die 102, FIG. 1) programmed for the production mode in which the fuse elements are disposed in a corner keep-out zone 503 of the die 502, with the connections between the pads of the die 502 and the fuse elements of the keep-out zone 503 depicted by pairs of letters A-M, wherein each pair of letters indicates a portion of the connection coupling the pad and its respective bus line or fuse element. The top metal layer of the die 502 implements die pads 501 and 504 that are coupled to respective VDD power buses 524 and 532 through a plurality of fuses 512 and 522, with die pad 501 coupled to fuse 512 and VDD power bus 524 through connection pair A-B and die pad 504 coupled to fuse 522 and VDD power bus 532 through connection pair K-L. As die pads 501 and 504 are connected to the VDD power busses 524 and 532 in this mode, the die pads 501 and 504 also are referred to herein as "power pads" 501 and 504. The top metal layer of the die 502 further implements die pads 508 and 510 that are coupled to respective VSS power busses 526 and 530 by a plurality of fuses 516 and 518, with die pad 508 coupled to fuse 516 and VDD power bus 526 through connection pair E-F and die pad 510 coupled to fuse 518 and VDD power bus 530 through connection pair G-H. As die pads 508 and 510 are connected to the VSS power busses 526 and 530 in this mode, the die pads 508 and 510 also are referred to herein as "ground pads" 508 and 510. The die 502 further implements anti-fuse 514 connected between power pad 501 and ground pad 508 and anti-fuse 520 connected between power pad 504 and ground pad 510, with power pad 501 and ground pad 508 being coupled through connection pair C-D and power pad 504 and ground pad 510 being coupled through connection pair I-J.

As noted, the fuse elements in the example of FIGS. 5 and 6 comprise electronic fuses and electronic anti-fuses, and thus are "programmed" via application of a programming signal. To provide this programming signal to all of the fuse elements to be included in a resulting stitch chain, the top metal layer of the die 502 further implements a die pad 506 that is coupled to fuses 512, 514, 516, 518, 520, and 522 through connection M. The die pad 506 serves to program all of the fuses and anti-fuses located in the keep-out zone 503 by distributing an activation signal received through a probe applied to the die pad 506, and thus the die pad 506 is also referred to herein as "activation pad 506."

In the production mode, illustrated in FIG. 5, the fuses 512, 516, 518, and 522 are "unprogrammed" and thus conductive, thereby coupling the die pads 501, 504, 508, and 510 to their respective power busses. Further, the anti-fuses 516 and 520 are likewise "unprogrammed," and thus non-conductive, thereby preventing connectivity between the power pad 501 and the ground pad 508 and preventing connectivity between the power pad 504 and the ground pad 510.

Turning to FIG. 6, a top-view of the die 502 during the process of programming the die 502 to enter the test mode is illustrated. This test mode programming is achieved by applying an activation signal to the fuse elements through a probe pin 602 applied to the activation pad 506 connected to the fuse elements disposed in the keep-out zone 503, thus forming a stitch chain 600 formed in an IC device implementing the die 502 after it has been programmed for the test mode. The fuse elements are shown in their programmed state in FIG. 6 with the fuses having been rendered non-conductive and the anti-fuses having been rendered conductive by probe pin 602.

For example, application of the activation signal to the activation pad 506 via probe pin 602 "programs" the fuse 512 so as to render the fuse 512 non-conductive, thereby electrically isolating the power pad 501 from the VDD bus 524. Likewise, application of the activation signal to the activation pad 506 through probe pin 602 "programs" the fuse 516 so as to render the fuse 516 non-conductive, thereby electrically isolating the ground pad 508 from the VSS bus 526. Further, the activation signal introduced by the probe pin 602 "programs" the anti-fuse 514 so as to render the anti-fuse 514 conductive, thereby electrically connecting the power pad 501 and the ground pad 508. Similarly, applications of the activation signal to the activation pad 506 through probe pin 602 "programs" fuses 518 and 522 and anti-fuse 520, which in turn electrically isolates ground pad 510 from VSS bus 530 and power pad 504 from VDD bus 532, respectively, while electrically connecting ground pad 510 and power pad 504.

Upon programming of the fuses and anti-fuses by probe pin 602 for test mode, a stitch chain 600 is formed in an IC device implementing the die 502 after it has been bonded to a test substrate, such as the substrate 104 of FIG. 1. A substrate-level link 604 of the stitch chain 600 is formed by a conductive path formed through a PCB and the test substrate, and through a solder bump or other die-level interconnect incorporating the pad 501. The substrate-level link 604 is followed in the stitch chain 600 by a die-level link 606 formed between the power pad 501 and the ground pad 508 through the programmed anti-fuse 514. The die-level link 606 is followed in the stitch chain 600 by a substrate-level link 608 formed as an electrical path from the ground pad 508 through a solder bump to corresponding substrate pad, and from this substrate pad to another substrate pad through one or more metal interconnects in the metal layers in the substrate, and from this other substrate pad up to the ground pad 510 through a corresponding solder bump. The next link, die-level link 610, is formed as a conductive path between the ground pad 510 and the power pad 504 due to the programmed anti-fuse 520. The die-level link 610 is then followed by a substrate-level link 612 formed by the substrate-level interconnect connecting the power pad 504 through a solder bump to a corresponding substrate pad of the substrate then on to another stitch in the chain (not shown) or out through the test substrate and to a PCB.

When the stitch chain 600 is completed with the bonding of the die 502 to the corresponding test substrate, and the resulting IC device mounted on a PCB, data regarding changes in resistance across the stitch change can be observed during testing of the die. With testing data obtained, BLR data can be generated regarding the die-level interconnects to provide to customers. While all of the die fabricated in a standard production run according to the design illustrated in FIGS. 5 and 6 can likewise be programmed for testing as described above, only a subset of the die will be programmed and tested with the remaining die being implemented into IC devices that are sold or distributed to customers.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit (IC) die comprising:
a set of pads at a periphery of a top metal layer;
a first set of fuse elements, each fuse element of the first set of fuse elements coupling a corresponding pad of the set to a corresponding power bus when in a conductive state;
a second set of fuse elements, each fuse element coupling a corresponding subset of pads of the set together when in a conductive state;
wherein the fuse elements of the first set comprise electronic fuses;
wherein the fuse elements of the second set comprise electronic anti-fuses; and
wherein the die further comprises:
an activation pad at the top metal layer, the activation pad electrically coupled to each electronic fuse of the first set and each electronic anti-fuse of the second set.

2. The IC die of claim 1, wherein the electronic fuses of the first set and the electronic anti-fuses of the second set are located in a keep-out zone of the die.

3. A method comprising:
electrically isolating a set of pads of a die and which are located at a periphery of the die from corresponding busses of the die by rendering non-conductive each fuse element of a first set of fuse elements of the die, the first set of fuse elements coupling the sets of pads to the respective busses;
electrically coupling subsets of pads of the set of pads by rendering conductive each fuse element of a second set of fuse elements of the die, the second set of fuse elements coupling the pads of each subset;
bonding the die to a substrate to form an integrated circuit (IC) device, the substrate having one or more interconnects coupling corresponding pairs of subsets of pads of the die so as to electrically connect the set of pads into an electrically-continuous chain that stitches between the die and the substrate; and
testing the IC device by monitoring a resistance across the chain.

4. The method of claim 3, wherein the fuse elements of the first set comprise at least one of: sacrificial fuses; and electronic fuses.

5. The method of claim 3, wherein the fuse elements of the second set comprise at least one of: sacrificial anti-fuses; and electronic anti-fuses.

6. The method of claim 3, wherein the set of pads are located at a corner of the die.

7. The method of claim 3, further comprising:
locating at least one of the first set of fuse elements and the second set of fuse elements in a keep-out zone of the die.

8. The method of claim 3, further comprising:
fabricating a set of die as a production run intended for inclusion in saleable integrated circuit devices; and
selecting the die from the set of die as a test die for the production run.

9. The method of claim 3, further comprising:
rendering non-conductive each fuse element of the first set of fuse elements by applying a voltage to each pad of the first set via a probe pin, wherein the fuse elements of the first set comprise sacrificial fuses; and
rendering conductive each fuse element of the second set of fuse elements by applying a voltage to each pad of the first set via a probe pin, wherein the fuse elements of the second set comprise sacrificial anti-fuses.

10. The method of claim 3, further comprising:
rendering non-conductive each fuse element of the first set of fuse elements by applying a voltage to an activation pad of the die via a probe pin, the activation pad electrically coupled to each electronic fuse of the first set and to each electronic anti-fuse of the second set, wherein the fuse elements of the first set comprise electronic fuses and the fuse elements of the second set comprise electronic anti-fuses; and
rendering conductive each fuse element of the second set by applying a voltage to the activation pad via a probe pin.

11. An integrated circuit (IC) device comprising:
a die comprising:
a set of pads at a periphery of a top metal layer;
a set of busses;
a first set of non-conductive fuse elements electrically isolating the set of pads from corresponding busses of the set of busses;
a second set of conductive fuse elements electrically coupling subsets of pads of the set of pads; and
a substrate bonded to the die, the substrate comprising one or more interconnects coupling corresponding pairs of subsets of pads of the die so as to electrically connect the set of pads into an electrically-continuous chain that stitches between the die and the substrate.

12. The IC device of claim 11, wherein the set of pads are located at a corner of the die.

13. The IC device of claim 11, wherein at least one of the first set of fuse elements and the second set of fuse elements is located in a keep-out zone of the die.

14. The IC device of claim 11, wherein:
the fuse elements of the first set comprise electronic fuses;
the fuse elements of the second set comprise electronic anti-fuses; and
the die further comprises:
an activation pad at the top metal layer, the activation pad electrically coupled to each electronic fuse of the first set and each electronic anti-fuse of the second set.

* * * * *